United States Patent [19]
Duerrschnabel et al.

[11] Patent Number: 4,810,468
[45] Date of Patent: Mar. 7, 1989

[54] COPPER-CHROMIUM-TITANIUM-SILICON-ALLOY

[75] Inventors: Wolfgang Duerrschnabel, Bellenberg; Franz Puckert, Illerrieden; Max Bletschacher, Voehringen-Illerberg, all of Fed. Rep. of Germany

[73] Assignee: Wieland-Werke AG, Ulm, Fed. Rep. of Germany

[21] Appl. No.: 104,756

[22] Filed: Oct. 2, 1987

[30] Foreign Application Priority Data

Oct. 17, 1986 [EP] European Pat. Off. ........ 86114376.6

[51] Int. Cl.⁴ .......................... C22C 9/00; C22F 1/08
[52] U.S. Cl. .................................. 420/490; 420/492; 420/495
[58] Field of Search ..................... 420/490, 492, 495

[56] References Cited

U.S. PATENT DOCUMENTS

| | | | |
|---|---|---|---|
| 2,189,198 | 2/1940 | Comstock | 75/160 |
| 4,036,642 | 7/1977 | Watson et al. | 420/492 |
| 4,260,435 | 4/1981 | Edens | 148/32.5 |
| 4,366,117 | 12/1982 | Tsuji | 420/481 |
| 4,601,879 | 7/1986 | Duerrschnabel et al. | 420/473 |
| 4,678,637 | 7/1987 | Duerrschnabel et al. | 420/490 |

FOREIGN PATENT DOCUMENTS

| | | |
|---|---|---|
| 3421198 | 6/1979 | Fed. Rep. of Germany . |
| 3527341 | 1/1980 | Fed. Rep. of Germany . |
| 1758055 | 10/1984 | Fed. Rep. of Germany . |
| 0116346 | 7/1984 | Japan ................. 420/492 |
| 0193233 | 11/1984 | Japan ................. 420/492 |
| 0194030 | 10/1985 | Japan ................. 420/492 |
| 535921 | 3/1983 | United Kingdom . |

OTHER PUBLICATIONS

Leadframe Materials from Tamagawa, Tamagawa Metal & Machinery Co., Ltd., pp. i–iii, 3, 4, 10.

*Primary Examiner*—Upendra Roy
*Attorney, Agent, or Firm*—Flynn, Thiel, Boutell & Tanis

[57] ABSTRACT

The invention relates to a copper-chromium-titanium-silicon-alloy, which consists essentially of 0.10 to 0.50% chromiun; 0.01 to 0.25% titanium; silicon; the remainder being copper and the usual impurities, wherein the silicon content (a) is more than 0.1-times of the titanium content, (b) when the titanium content is up to 0.099% the silicon content is limited by the equation:

Silicon content (%)=0.05%+0.5 titanium content (%), and (c) when the titanium content is more than 0.099%, the silicon content is limited by the equation:

silicon (%)=0.149%−0.5% titanium content (%).

Because of its excellent properties, the alloy is used as a material for electronic components, in particular semiconductor carriers for transistors, integrated circuits or the like, for plug connectors and parts for electrical systems for cars.

1 Claim, 2 Drawing Sheets

COPPER-CHROMIUM-TITANIUM-SILICON-ALLOY

The invention relates to a copper-chromium-titanium-silicon-alloy, a method for its manufacture and its use.

There exists a great need for copper alloys for electrical purposes. These alloys are, amongst other uses, needed as materials for electronic components, in particular semiconductor carriers (so-called leadframes) for transistors, integrated circuits or the like, for plug connectors and parts for electrical systems for cars.

Materials for electronic components, in particular semiconductor carriers of the above-mentioned type, must have combinations of specific properties as follows:

(a) the electrical and thermal conductivity should be as high as possible (approximately, above 50% IACS);

(b) a high mechanical strength is required, together with a sufficient bendability;

(c) moreover, a high resistance to softening is demanded;

(d) homogeneous materials are increasingly demanded, namely, materials the structure of which does not contain any coarse precipitates or inclusions. With this one achieves, on the one hand, a satisfactory connection between the so-called bonding wires and the semiconductor carrier and, on the other hand, if necessary for the further processing steps, a good galvanic or chemical surface refinement.

(e) in order to be able to manufacture strip material for the above-mentioned purpose in an economical manner, it is furthermore important that the alloys are easy to cold form and they can be rolled to form strips.

So far, iron-nickel-alloys or copper-alloys, as for example CuFe2P (C 19400) or CuFeSnP (C 19520), are mostly used among others for the mentioned application. Also in the above-mentioned copper alloys, in particular the electrical conductivity and the homogeneity of the materials are not satisfactory because of the relatively high alloy proportions, which partly results in undesired coarse precipitates.

For connecting components in electrical systems for cars, because of the high current loads, there is demanded a material having the highest possible electrical and thermal conductivity and, at the same time, high strength and thus sufficient mechanical stability and improved corrosion resistance compared with brass alloys.

Therefore, the basic object of the invention is to provide a copper alloy which has properties which are particularly favorable for the above-mentioned fields of application, and which can be manufactured at a comparatively low price.

According to the invention, there is provided a copper-chromium-titanium-silicon-alloy which consists essentially of 0.10 to 0.50% chromium; 0.01 to 0.25% titanium, silicon, the remainder being copper and usual impurities, wherein the silicon content is (a) higher than 0.1-times the titanium content, (b) for alloys having a titanium content of up to 0.099%, the maximum silicon content satisfies the equation I:

I. silicon content (%)=0.05%+0.5 titanium content (%), and (c) for alloys having a titanium content of higher than 0.099%, the maximum silicon content satisfies the equation II:

II. silicon content (%)=0.149%−0.5 titanium content (%).

The percentages set forth in this specification are percentages by weight.

The advantageous properties of the alloy according to the invention will be discussed in greater detail later on in connection with one exemplary embodiment. The alloy is, furthermore, inexpensive due to the low content of relatively inexpensive alloy elements and because the manufacture of the alloy is simple.

An alloy with 0.3 to 7% chromium and/or titanium and 0.1 to 3% silicon can be derived from German OS No. 1 758 055, but it does not give any suggestion to the man skilled in the art to lower the silicon content to below 0.1%. Such low silicon contents were formerly considered to be disadvantageous for achieving the combinations of properties desired for this type of alloy.

Furthermore, U.S. Pat. No. 2,189.198 discloses a copper-chromium-titanium-silicon-alloy with approximately 0.1 to 0.6% chromium, approximately 0.6 to 1.5% titanium and 0.1 to 0.6% silicon, but particularly good results are achieved with a titanium content of approximately 1%, so that it was in particular not obvious to employ a titanium content of below 0.6%. In addition, these alloys are mainly used as base metals. The most favorable combinations of properties can only be achieved if quenching is done from a high solution temperature and precipitation treatment occurs thereafter at moderate temperatures for very long times, for example, over 16 h. This very uneconomical procedure results, in addition, only in electrical conductivity values of approximately 50% IACS and a hardness of 109 HB (Brinell hardness). These alloys, therefore, are not satisfactory for the aforementioned purpose.

According to particular embodiments of the present invention wherein the silicon content is determined by equation I or equation II, high to very high conductivities are achieved with at least good strengths or very high strengths are achieved with at least good conductivities.

With an alloy composition containing from 0.01 to 0.049% titanium, very high conductivities are achieved with good strengths, and with an alloy composition containing higher than 0.049 up to 0.099% titanium, high conductivities and high strengths are simultaneously achieved.

The invention furthermore provides a method for the manufacture of the inventive alloy. To achieve favorable combinations of properties, after the ingot has been cast, the alloy is homogenized preferably at temperatures of 850° to 950° C. for from 1 to 24 hours, is hot-rolled at a temperature of 600° to 830° C. using one or several passes through the rolls and then is cooled to room temperature with a cooling rate of between 10° C. per minute and 2000° C. per minute.

It is advisable to carry out the hot-rolling, in particular, at 650° to 750° C. and to carry out the cooling in particular with a cooling rate of between 50° C. per minute and 1000° C. per minute. According to a preferred embodiment of the method, after the cooling down, the strip is cold rolled with a reduction degree of up to 95%, using one or several passes through the rolls. The alloy can be annealed up to a maximum of 10 hours between the cold-rolling passes, preferably to achieve an even dispersion of the precipitates.

To achieve the desired properties, it is advisable to anneal the strip in a bell-type annealing furnace at a temperature of 350° to 500° C. or continuously in a continuous annealing furnace at a temperature of 450° to 600° C.

The last cold-rolling pass is preferably followed by a tempering treatment at the aforementioned temperatures.

Thus, the inventive alloy can be manufactured in a simple manner employing method steps commonly used in the semi-finished product industry, like casting, hot-forming, cold-forming, intermediate annealing, cold-reforming, final annealing, etc. The alloy can be manufactured without a quenching treatment. The annealing times lie within the usual limits so that there can be used continuous working furnaces with relatively short dwell periods of the strips at high temperatures.

The inventive copper-chronium-titanium-silicon-alloy is preferably used as a material for electronic components, in particular, semiconductor carriers for transistors, integrated circuits or the like, for plug connectors and parts for electrical systems for cars.

When an inventive alloy with a titanium content of up to 0.099% is used as a material for the above-mentioned purpose, the electrical conductivity of that material lies above 65% IACS and the Brinell hardness of that material remains, after an annealing treatment of a cold-formed strip for 1 hour at 470° C., above 115 HB. When an alloy with a titanium content of more than 0.099% is used as a material, the electrical conductivity of that material lies between 50 and 65% IACS and the Brinell hardness of that material remains, after the described annealing treatment, above 145 HB.

When an alloy with a titanium content of up to 0.049% is used as a material for the above-mentioned purposes, th electrical conductivity of that alloy lies above 78% IACS and the Brinell hardness of that material remains, after the described annealing treatment, above 15 HB.

When an alloy with a titanium content of from more than 0.049% up to 0.099% is used as a material for the above-mentioned purposes, the electrical conductivity of that material lies between 65 and 78% IACS and the Brinell hardness of that material remains, after the described annealing treatment, above 130 HB.

The mechanical properties and the softening behaviors of the alloys are hereby characterized together by enploying, as a characteristic feature indicative of both properties, the Brinell hardness (HB), after a one-hour annealing at 470° C., of a previously cold-formed strip. The invention will be discussed in greater detail in connection with the following exemplary embodiment:

BRIEF DESCRIPTION OF THE DRAWINGS

FIG. 1 illustrates the relationship between the titanium content and the silicon content of the inventive alloy (the chromium content remains substantially constant). The alloys according to the invention lie in the area on and within the four-sided irregular polygon defined by the four straight lines: (1) Si (%) =0.1 Ti (%), (2) Si (%) =0.05% +0.5 Ti % (for 0.01 to 0.099% Ti), (3) Si (%) =0.149% −0.5 Ti (%) (for>0.099 to 0.25% Ti) and (4) Ti (%) =0.01% .

Figure 1:
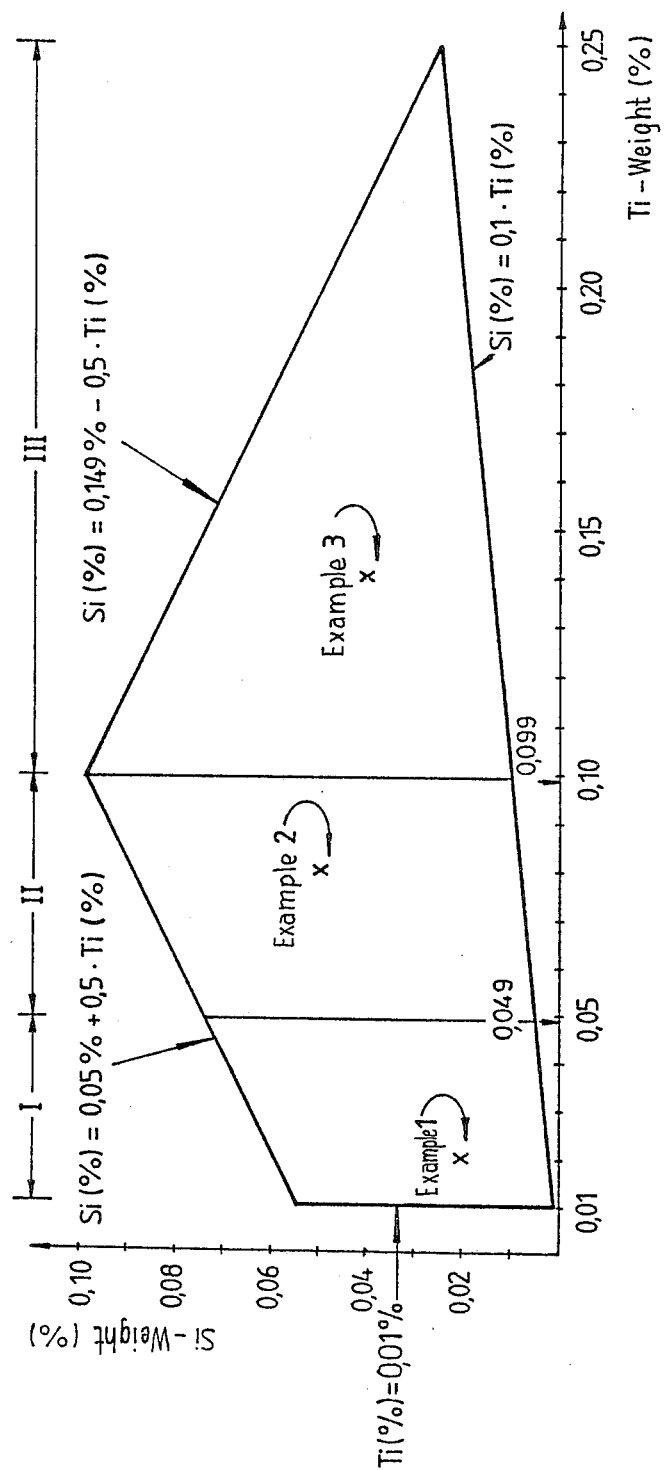
FIG. 1 is a graph of the silicon content versus the titanium content of copper-chromium-titanium-silicon alloys.

Table 1 shows the compositions of three inventive alloys (Nos. 1, 2, 3) from the areas characterized with roman numerals I, II, III in FIG. 1, respectively.

TABLE 1

| Designation of Sample | Composition of the samples (quantities given in weight %) | | | |
|---|---|---|---|---|
| | Cr | Ti | Si | Cu and impurities |
| 1 | 0.33 | 0.02 | 0.02 | remainder |
| 2 | 0.28 | 0.08 | 0.05 | remainder |
| 3 | 0.29 | 0.14 | 0.04 | remainder |

The three alloys were manufactured commercially using the customary steps: Casting, initial heating, hot-rolling, cooling down in air, then cold-rolling and intermediate annealing carried out alternately.

The ingots were heated at 900° C. for several hours to a hot-rolling temperature, were hot-rolled and then continuously cooled down in air. The cold-rolling to an intermediate thickness of 4.0 mm. was followed by an annealing treatment at 470° C./1 h. After a final rolling to the desired final thickness (for example 0.254 mm.), the tensile strength, Brinell hardness HB and the electrical conductivity were measured.

The mechanical and electrical properties of the samples are compiled in Table 2, together with the corresponding values for prior art alloys, which were taken from the literature (compare for example the company magazine "Leadframe Materials from Tamagawa" (1983), in particular Pages 3, 4, 10, of the Company Tamagawa Metal & Machinery Co., Ltd.).

TABLE 2

| Electrical and mechanical properties (condition: 80% cold-formed and tempered, strip thickness 0.254 mm.) | | | | |
|---|---|---|---|---|
| Sample Design. | (UNS- Design. | Tensile strength N/mm.$^2$) | Brinell Hardness HB | Electrical Conductivity (% IACS) |
| 1 | | 520 | 130 | 85 |
| 2 | | 560 | 144 | 78 |
| 3 | | 595 | 158 | 63 |
| CuFe2P | (C19400) | 480 | 128 | 65 |
| CuFeSnP | (C19520) | 540 | 147 | 48 |
| CuZn15 | (C23000) | 450 | 120 | 37 |

It is evident that each of the inventive alloy Samples 1 and 2 has a significantly higher conductivity than the prior art alloys, while the inventive alloy Sample 3, with a comparable conductivity, achieves unsurpassed strength and hardness values.

The alloys in the area I of FIG. 1 are characterized by very high electrical conductivities of above 78% IACS and by good strengths (Brinell hardness>115 HB), the alloys in the area II are characterized by high electrical conductivities in the range of 65 to 78% IACS and by simultaneous good strengths (Brinell Hardness>130 HB) and the alloys in the area III are characterized by good electrical conductivities in the range of 50 to 65% IACS and very high strengths (Brinell hardness>145 HB).

Figure 2:
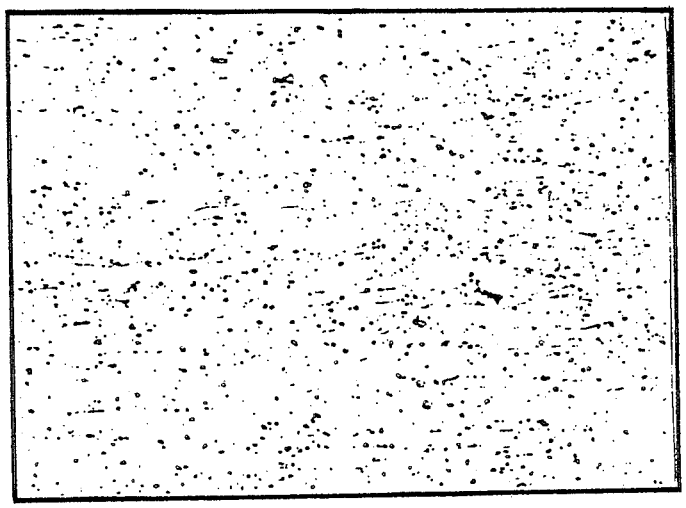
FIG. 2 is a photomicrograph of a specimen of invention alloy Sample 2 at a magnification of 1000X.

The excellent mechanical and electrical properties of the inventive alloy result from extremely fine precipitates, homogeneously distributed in the copper matrix, of the participating alloy elements chromium, titanium and silicon. FIG. 2 shows, for example, the structure of the inventive alloy Sample 2 in tempered condition at a magnification of 1000 : 1. (The alloy Samples 1 to 3 have almost an identical structure). From this, it is evident that the sizes of the very small precipitated particles, which increase the strength and conductivity, are of the order of magnitude of 1 μm and below.

This favorable precipitation characteristic is achieved without special heat treatment with quenching in water and subsequent tempering, which is common in precipitate-forming alloys. It is developed during the manufacturing method commonly used for manufacturing naturally hard copper alloys, which manufacturing method is characterized by the steps of initial heating, hot-rolling, cooling in air, then cold-rolling and intermediate annealing alternately. The alloy has, therefore, substantial advantages in terms of production technology, as compared with the previously known copper-chromium-silicon or copper-chromium-titanium alloys.

This simplified and, thus, less expensive manufacturing method (without a quenching treatment) can only be achieved, without loss of properties, by employing the combination, present in the inventive alloys, of the alloy elements and the specified low contents thereof. When higher proportions of the alloy elements chromium, titanium and silicon are used than those of the inventive alloy, at least one of the above-mentioned properties deteriorates, usually, however, several properties deteriorate simultaneously.

A property of the inventive alloy which is to be particularly emphasized is its good bendability. Even in the tempered condition, it is possible, even with the inventive alloys having the highest strengths and hardnesses, to effect sharp-edged 90° bends, both perpendicular and parallel to the direction of rolling, without the formation of cracks. In contrast, copper-chromium-silicon and copper-chromium-titanium alloys of the previously known compositions exhibit significantly poorer bendinq properties. The fine and homogeneously distributed precipitate particles are also responsible for the excellent bendability of the inventive alloys, since these obviously retard or prevent the propagation of cracks into the interior of the strip. Metallographic investigations have established that an incipient flaw does not further proceed perpendicular to the surface of the strip, but rather, is deflected approximately parallel to the surface of the strip so that only a certain degree of pitting, but no actual cracking, occurs. This bending behavior is of a particular importance in the case of so-called surface-mounted devices (SMD), because the connecting legs are bent in a sharp-edged manner and should thereafter as far as possible no longer exhibit any spring-back resilience.

We claim:

1. A copper-chromium-titanium-silicon alloy, consisting essentially of 0.10 to 0.50% chromium; 0.01 to 0.049% titanium; silicon; the remainder being copper and the usual impurities, wherein the minimum amount of silicon is defined by the equation Si (%)=0.1 Ti (%) and the maximum amount of silicon is defined by the equation Si (%)=0.05 (%)+0.5 Ti (%).

* * * * *